United States Patent [19]

Mine

[11] Patent Number: 5,206,529
[45] Date of Patent: Apr. 27, 1993

[54] SEMICONDUCTOR INTEGRATED CIRCUIT DEVICE

[75] Inventor: Hirotoshi Mine, Tokyo, Japan

[73] Assignee: NEC Corporation, Japan

[21] Appl. No.: 877,251

[22] Filed: Apr. 28, 1992

Related U.S. Application Data

[63] Continuation of Ser. No. 584,621, Sep. 19, 1990, abandoned.

[30] Foreign Application Priority Data

Sep. 25, 1989 [JP] Japan .................. 1-248532

[51] Int. Cl.⁵ ............... H01L 27/02; H01L 23/48
[52] U.S. Cl. .................. 257/202; 257/203; 257/207; 257/208; 257/210
[58] Field of Search ............ 357/68, 45, 71; 257/202, 203, 208, 210

[56] References Cited

U.S. PATENT DOCUMENTS

| | | | |
|---|---|---|---|
| 4,774,559 | 9/1988 | Culican et al. | 357/45 |
| 4,833,520 | 5/1989 | Ito et al. | 357/45 |
| 4,910,574 | 3/1990 | Aipperspach et al. | 357/45 |
| 4,924,290 | 5/1990 | Enkaku et al. | 357/45 |

FOREIGN PATENT DOCUMENTS 60-245271 12/1985 Japan .................. 357/45

Primary Examiner—Eugene R. LaRoche
Assistant Examiner—Viet Q. Nguyen
Attorney, Agent, or Firm—Laff, Whitesel, Conte & Saret

[57] ABSTRACT

A semiconductor integrated circuit device wherein a plurality of macros are formed on a master chip and wirings are provided striding across a specific macro and thereon through a thick insulating film, whereby parasitic capacitance is reduced and high speed operation of a circuit is attained.

6 Claims, 3 Drawing Sheets

SEMICONDUCTOR INTEGRATED CIRCUIT DEVICE

This application is a continuation of application Ser. No. 07/584,621, filed Sep. 19, 1990 now abandoned.

BACKGROUND OF THE INVENTION

1. Field of the Invention

This invention relates to a semiconductor integrated circuit device, particularly to a semiconductor integrated circuit device wherein chips due to such a master slice that a plurality of basic cells are regularly placed on a semiconductor substrate are used and a plurality of macrocell functional blocks which were previously prepared are formed in combination with each other on said chips so as to fulfill a prescribed function.

2. Description of the Prior Art

In a semiconductor integrated circuit device made according to a master slice method, a chip of a master wafer, i.e. a master chip, on which basic cells are regularly placed is provided. A logic design is worked out using macrocells, i.e. macros, which are previously designed and registered in a library. Wirings are performed on the master chip according to the design so as to realize a necessary logic and memory function on said chip.

The term "macro" means the cell which has a number of functions, many elements and large area. According to the size of the macro, it is referred to as a large scale, middle scale or small scale macro.

According to the above master slice method, it is possible to accomplish a product within a short time after receipt of a user's request and to supply at a relatively low price a product according to a diversified small-quantity production.

In the above-mentioned semiconductor integrated circuit device, integrated density is yearly improved. A logic circuit which can be constructed on one semiconductor integrated circuit tends to become large. Consequently, it has become possible for one semiconductor integrated circuit device to gather a circuit of such a scale that previously a design had to be worked out distributing it into a plurality of semiconductor integrated circuit devices. With regard to macros to be registered in the library, it has become necessary for such a large scale circuit that a design has been worked out as one semiconductor integrated circuit is treated as one macro. Such large scale macro includes, for example, a RAM, ROM, microprocessor and the like.

When the integrated circuit device could be constructed only by small scale macros, wirings between the macros were enough. Wirings between the adjacent macros and wirings jumping over the macros were not necessary. However, if the large scale macro, as mentioned above, is placed in the semiconductor integrated circuit device, signal wirings between the other macros and those between the macros and input-output buffers must be made on the large scale macro.

As a result, the wiring length becomes longer and a large parasitic capacitance is caused between the wiring layer and semiconductor element, thus high speed operation of the circuit is prevented. In addition, the logic design is subject to restriction on the aspect of fan in and fan out. Namely, for an output of some functional block, restrictions are generally put on output loading with reference to an index referred to as a fan out factor according to driving capability, but the logic design must be worked out by adding to this factor the load of parasitic capacitance due to the wirings. In the case that the parasitic capacitance is great, therefore, restrictions on the output loading become great and a free design is prevented.

SUMMARY OF THE INVENTION

It is an object of the invention to provide an improved semiconductor integrated circuit device due to a master slice method wherein the large scale macro is provided and wirings are formed thereon so that the parasitic capacitance can be lowered, thus the high speed operation of the circuit can be accomplished and the logic design can be freely worked out.

The above object is accomplished by providing a semiconductor integrated circuit device in which a plurality of macros which is a registered functional block are provided on a master chip in which basic cells are regularly placed. On a specific macro, i.e. a large scale macro, among a plurality of macros, wirings are provided striding across the macro through an insulating film thicker than an interlayer insulating film in the other portion.

BRIEF DESCRIPTION OF THE DRAWINGS

By way of example of the many features and advantages of the invention, an illustrative embodiment in the semiconductor integrated circuit device is described below and shown in the accompanying drawings, in which.

Figure 1:
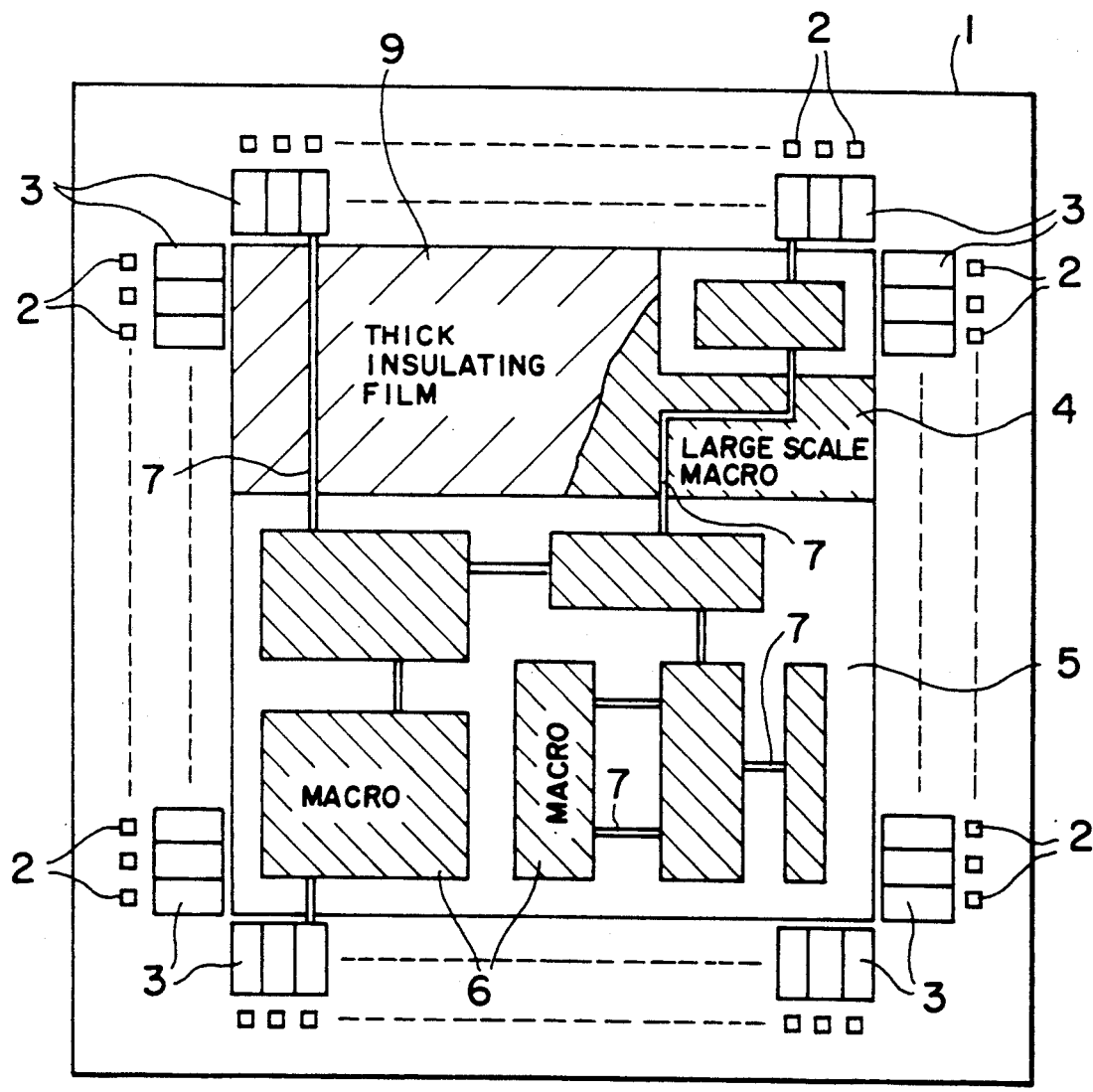
FIG. 1 shows a plan view of one embodiment of this invention.

FIG. (b) is a sectional view of the principal part of the embodiment as shown in FIG. 1, showing a connection of power source wiring.

Figure 3:
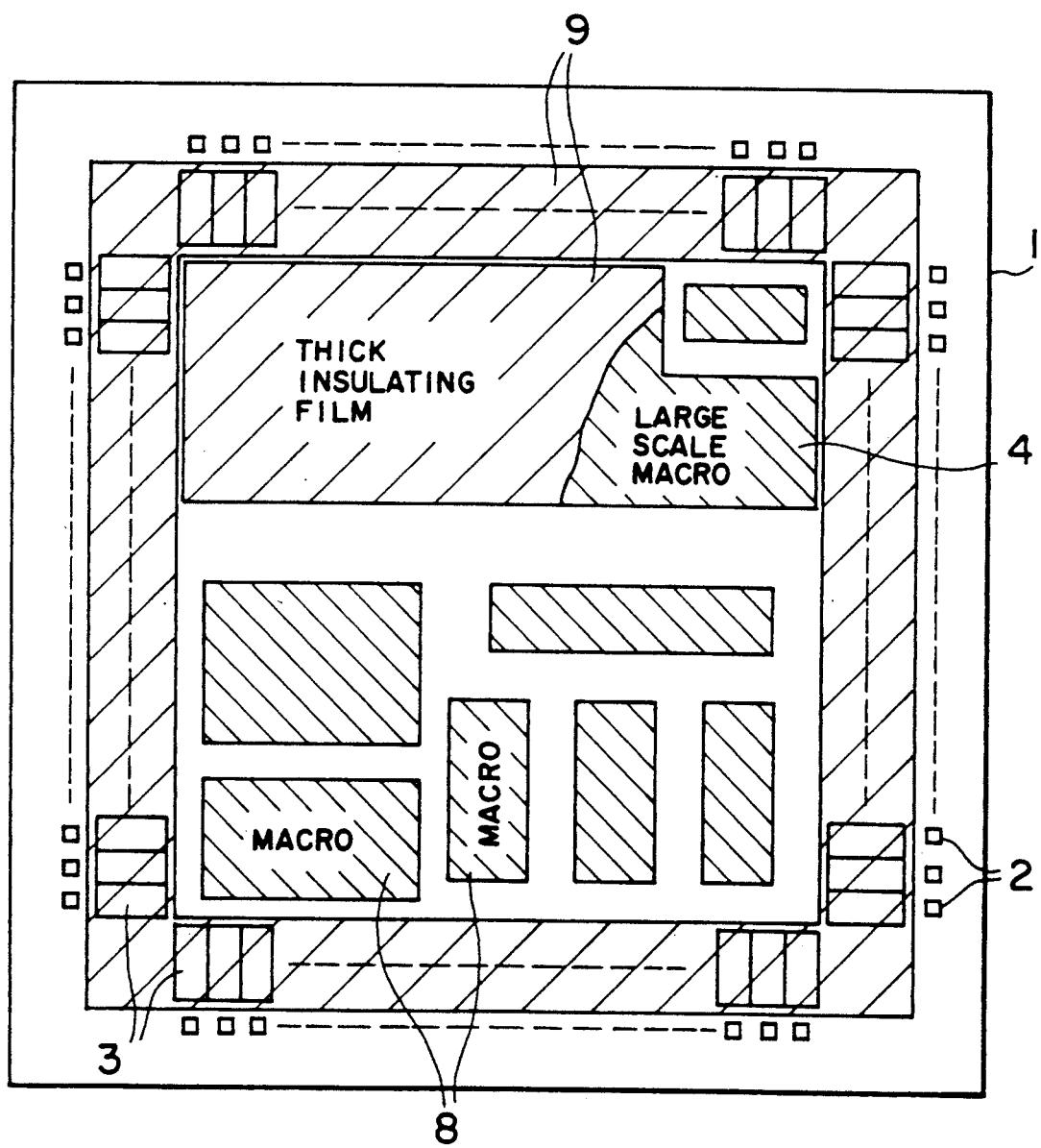

FIG. 3 shows a plan view of another embodiment of this invention.

DETAILED DESCRIPTION OF THE PREFERRED EMBODIMENTS

In the inventive semiconductor integrated circuit device made by the master slice method, wirings striding across a specific macro, i.e. a large scale macro among a plurality of registered macros are made on the macro through an insulating film thicker than an interlayer insulating film in the other portion, whereby it becomes possible to lower the parasitic capacitance.

Figure 2A:
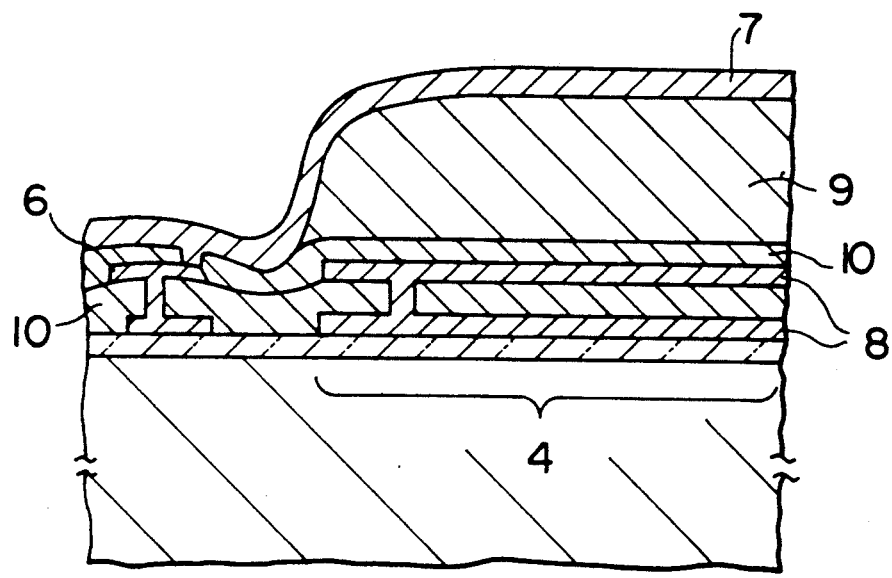
FIG. 2 (a) is a sectional view of the portion of the large scale macro in the embodiment as shown in FIG. 1, showing connection of a signal wiring.
Figure 2B:
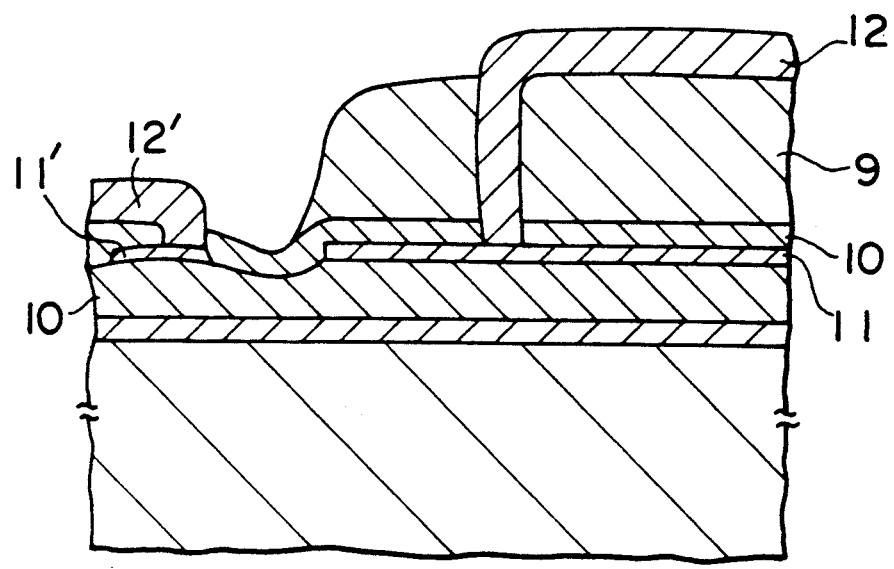

Moreover, a power wiring 12, 12' (FIG. 2 (b)) among the wirings striding across the specific macro is connected with a power wiring 11, 11' (FIG. 2 (b)) of the above specific macro through a contact hole formed in the thicker insulating film, but a signal wiring among said wirings is not connected with said specific macro.

Next, this invention will be described with reference to the accompanying drawings.

FIG. 1 shows a plan view of a semiconductor integrated circuit device made by a master slice method, according to one embodiment of this invention. As shown in FIG. 1, a plurality of external terminals (bonding pads) 2 and a plurality of input-output buffer circuits 3 are placed, respectively, on the periphery of the semiconductor integrated circuit device 1 of this embodiment. A center portion of the above semiconductor integrated circuit device 1 is an internal cell region 5 wherein a large scale macro 4 is provided in addition to middle and small macros 6. The macros 6 are connected to each other through signal wirings 7. The external terminals 2 and macros 6 are connected through signal wirings 7, while a part of the signal wirings 7 is passed on the large scale macro 4. FIG. 2 (a) is a sectional view of the portion of the large scale macro 4 as shown in FIG. 1, illustrating a connection of a signal wiring. As shown in FIG. 2 (a), in the portion of the large scale macro 4, wirings 8 within the macro are formed through an insulating film 10 (this construction is also similar to the other macros 6), on which a signal wiring 7 is formed through a thick insulating film 9.

The wiring within the macro is made within the macro and is not drawn out of the macro.

Since the wiring 7 is formed through the thick insulating film 9 as mentioned above, no great parasitic capacitance is caused between a semiconductor element and this wiring even if the wiring length becomes longer. According to this invention, therefore, even if the large scale macro is used, the restriction on the design does not become big and it is possible to keep the high speed operation of the circuit. Now, if the thick insulating film is used as an interlayer insulating film, generally, it is difficult to form a contact hole in this film, thus the yield is deteriorated. In this invention, however, the signal wiring 7 passing on the large scale macro 4 is used to connect the other macros each other and to contact the external terminals with the macros. Thus, it is not necessary to form a contact hole in the above thick insulating film 9. Therefore, the yield is not reduced by thickening the insulating film. However, a contact hole for a power wire 12, 12' may be made in this thick insulating film 9. Since the power wire can be big and also since the sectional area of the contact hole therefore can be large, it is possible to easily form the contact hole even if the insulating film is thick.

FIG. 3 shows a plan view of another embodiment of this invention (In FIG. 3, a signal wire is not shown). Also in this embodiment, a thick insulating film 9 is provided on a large scale macro 4 so as to result in reduced parasitic capacitance due to wirings and the like. In this embodiment, furthermore, a thick insulating film 9 is also provided on an input-output buffer circuit 3 which is placed on the periphery of a semiconductor integrated circuit device 1. For this construction, it is possible to reduce also parasitic capacitance due to signal wirings on the input-output buffer circuits.

Moreover, the master wafer to be used in this invention may be one wherein wiring channel regions are provided between the lines of the basic cells and also one wherein the basic cells are formed throughout the internal region, so-called SOG type wafer. In addition, the circuit which is formed in this invention may include either of TTL, ECL, CMOS, BiSMOS or the like and further the combined circuit thereof.

From the foregoing, it will be appreciated that with the semiconductor integrated circuit device according to this invention, the large scale macro and middle and small scale macros are placed in combination with each other on the master chip. On the large scale macro, the wirings are provided striding across the macro through the thick insulating film. It is possible to make the parasitic capacitance even lower if the large scale macro is loaded on the semiconductor integrated circuit device by to the master slice method. According to this invention, therefore, it is possible to attain the high speed circuit operation and to relax restrictions on the logic design since the number of fan out is not reduced.

What is claimed is:

1. A semiconductor integrated circuit wherein a plurality of macros are formed on a master chip in which a plurality of basic cells are regularly arranged, each of said macros being a functional block registered in a library, said integrated circuits having at least one interlayer insulating film, an insulating film substantially thicker than said interlayer insulating film selectively formed on a specific macro, a power line formed on the thick insulating film and extending across the specific macro, said power line being connected to said specific macro through a contact hole formed in said thick insulating film, and signal lines interconnecting the macros other than said specific macro, said signal lines extending across said thick insulating film disposed on said specific macro.

2. A semiconductor integrated circuit device as defined in claim 1, wherein said specific macro is taken from a class consisting of a RAM, ROM or microprocessor.

3. A semiconductor integrated circuit device as defined in claim 1, wherein a peripheral area of the device has a plurality of external terminals and input-output buffer circuits, and large, middle and small scale macros on said device, said large scale macro being located on the center of the device.

4. A semiconductor integrated circuit device as defined in claim 1, and input-output buffer circuits, a further thick insulating film on the input-output buffer circuits.

5. A semiconductor integrated circuit device as defined in any of the claims 1 and 2, wherein a plurality of external terminals and input-output buffer circuits are placed on a periphery of the device and a large scale macro and said middle and small macros are provided on a center of the device.

6. A semiconductor integrated circuit device as defined in claim 5, wherein a thick insulating film is provided further on the input-output buffer circuits.

* * * * *